(12) United States Patent
Yue et al.

(10) Patent No.: US 7,199,032 B2
(45) Date of Patent: Apr. 3, 2007

(54) METAL SILICIDE INDUCED LATERAL EXCESSIVE ENCROACHMENT REDUCTION BY SILICON <110> CHANNEL STUFFING

(75) Inventors: Duofeng Yue, Plano, TX (US); Peijun J. Chen, Dallas, TX (US); Sue Ellen Crank, Coppell, TX (US); Thomas D. Bonifield, Dallas, TX (US); Jiong-Ping Lu, Richardson, TX (US); Jie-Jie Xu, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/903,319

(22) Filed: Jul. 30, 2004

(65) Prior Publication Data

US 2006/0024935 A1    Feb. 2, 2006

(51) Int. Cl.
*H01L 21/28* (2006.01)
*H01L 21/44* (2006.01)

(52) U.S. Cl. .................. 438/581; 438/655; 438/682

(58) Field of Classification Search .......... 438/581, 438/583, 649, 651, 682, 721
See application file for complete search history.

(56) References Cited

U.S. PATENT DOCUMENTS

| | | | |
|---|---|---|---|
| 6,096,609 A * | 8/2000 | Kim et al. | 438/281 |
| 6,555,453 B1 * | 4/2003 | Xiang et al. | 438/581 |
| 6,562,718 B1 * | 5/2003 | Xiang et al. | 438/682 |
| 6,821,887 B2 * | 11/2004 | Wieczorek et al. | 438/664 |
| 7,029,967 B2 * | 4/2006 | Zhao et al. | 438/199 |
| 2004/0099916 A1 * | 5/2004 | Rotondaro et al. | 257/412 |

* cited by examiner

*Primary Examiner*—Chuong Anh Luu
(74) *Attorney, Agent, or Firm*—Peter K. McLarty; W. James Brady, III; Frederick J. Telecky, Jr.

(57) ABSTRACT

The present invention provides a method of manufacturing a metal silicide electrode (100) for a semiconductor device (110). The method comprises implanting small atoms into an nMOS semiconductor substrate (130) to a depth (132) no greater than about 30 nanometers into the nMOS semiconductor substrate. The method further comprises depositing a transition metal layer (400) over the nMOS semiconductor substrate. The transition metal layer and the nMOS semiconductor substrate are reacted to form the metal silicide electrode. Other aspects of the present invention include a method of manufacturing an integrated circuit (700).

23 Claims, 9 Drawing Sheets

METAL SILICIDE INDUCED LATERAL EXCESSIVE ENCROACHMENT REDUCTION BY SILICON <110> CHANNEL STUFFING

TECHNICAL FIELD OF THE INVENTION

The present invention is directed, in general, to a method for manufacturing a semiconductor device, and more specifically, to a method for manufacturing devices having metal silicide electrodes thereon.

BACKGROUND OF THE INVENTION

The continuing push to produce faster semiconductor devices with lower power consumption has resulted in transistor miniaturization and higher integrated circuit packing densities with each new technology node. For instance, transistors with smaller components allow a higher packing density, which is conducive to faster device operating speeds. Along with shrinking transistor geometries, however, also come a number of challenges to optimize both transistor and integrated circuit (IC) layout design.

One consequence of transistor miniaturization is the construction of smaller gates and source/drain regions in transistors. This, in turn, has caused changes in the composition and construction of the source/drain electrodes used to facilitate device interconnection. To produce a transistor with a sufficiently low series resistance, each transition to a new technology node, has seen the source/drain electrode's composition change from titanium silicide, to cobalt silicide, and now nickel silicide.

Unfortunately a number of problems have been encountered when manufacturing transistors with nickel silicide source/drain electrodes. In some cases, unacceptable numbers of nonfunctional transistors are constructed. In other instances, the source and drain regions punch through the source/drain junction into the semiconductor substrate, resulting in a large leakage current. In still other cases, there is an unacceptably large diode leakage between the source and drain regions and the semiconductor substrate. These problems contribute to the production of unacceptably low yields of transistors that operate within performance specifications.

Accordingly, what is needed in the art is method of manufacturing a semiconductor device with metal silicide source/drain electrodes that do not suffer from the disadvantages associated with conventionally manufactured metal silicide source/drain electrodes, as discussed above.

SUMMARY OF THE INVENTION

To address the above-discussed deficiencies of the prior art, the present invention provides in one embodiment, a method of manufacturing a metal silicide electrode for a semiconductor device. The method includes implanting small atoms into an nMOS semiconductor substrate to a depth no greater than about 30 nanometers into the nMOS semiconductor substrate. The method further includes depositing a transition metal layer over the nMOS semiconductor substrate. The transition metal layer and the nMOS semiconductor substrate are reacted to form the metal silicide electrode.

Another aspect of the present invention is a method of manufacturing an integrated circuit. This embodiment includes forming metal silicide electrodes on a semiconductor device as described above. The method includes forming interconnect metals lines on one of more insulating layers located over the semiconductor device and connecting the interconnects with the metal silicide electrodes to form an operative device.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the scope of the invention.

BRIEF DESCRIPTION OF THE DRAWINGS

For a more complete understanding of the present invention, reference is now made to the following detailed description taken in conjunction with the accompanying FIGS. It is emphasized that various features may not be drawn to scale. In fact, the dimensions of various features may be arbitrarily increased or reduced for clarity of discussion. In addition, it is emphasized that some circuit components may not be illustrated for clarity of discussion. Reference is now made to the following descriptions taken in conjunction with the accompanying drawings, in which.

DETAILED DESCRIPTION

During the course of studying transmission electron microscope (TEM) images of nMOS transistors having nickel silicide source/drain electrodes, excessive encroachment defects extending into channel region have been detected. The long axis of the excessive encroachment defects is in a direction parallel with the <110> direction of the silicon substrate. While not limiting the scope of the present invention by theory, it is believed that channels in the lattice structure of the silicon substrate in the <110> direction have a sufficiently wide opening to allow nickel atoms to rapidly diffuse into the channels. It is further believed that source/drain dopant implantation creates distortions along the <110> direction that cause the channels to widen. In particular larger mass dopants, such as arsenic, are thought to exacerbate channel widening. Nickel atoms that have diffused into these widened channels are thought to form into nickel silicide structures corresponding to the excessive encroachment defects.

It is further believed that nickel diffusion into the widened <110> channels is impeded by introducing small atoms into regions of the silicon substrate that are silicided to form electrodes. It is further thought that the small atoms are loaded or stuffed into the interstitial space of the channels, thereby retarding the diffusion of nickel through the channels. This, in turn prevents the formation of nickel silicide excessive encroachment that can cause shorts and increased leakage currents in semiconductor devices have nickel silicide electrodes.

The above discussion presents aspects of the present invention in the context of nickel silicide electrode induced defects in dopant-implanted source/drain regions of an nMOS transistor. It is emphasized, however, that the scope of the present invention includes reducing such defects in any semiconductor substrate caused by the formation of any electrode comprising a transition metal silicide.

The term, small atoms, as used herein is defined as atoms having an atomic radius of about 85 picometers or less. One of ordinary skill in the art would understand how to determine atomic radii. For instance, atomic radii can be determined by the comparison of bond lengths in ionic, metallic, and covalent crystals and molecules using the method of J. C. Slater, J. Chem. Phys. 1964, 39, 3199, incorporated by reference herein in its entirety.

For the purposes of the present invention, a transition metal is defined as any element in Periods 4–6 and Groups 3–12 of the Periodic Table of Elements (International Union of Pure and Applied Chemist Convention for designating Groups and Periods).

One embodiment of the present invention is a method of manufacturing a metal silicide electrode. FIGS. 1 to 6 illustrate cross-sectional views of selected steps in exemplary methods of manufacturing a metal silicide electrode 100 for a semiconductor device 110 according to the principles of the present invention.

Figure 1:
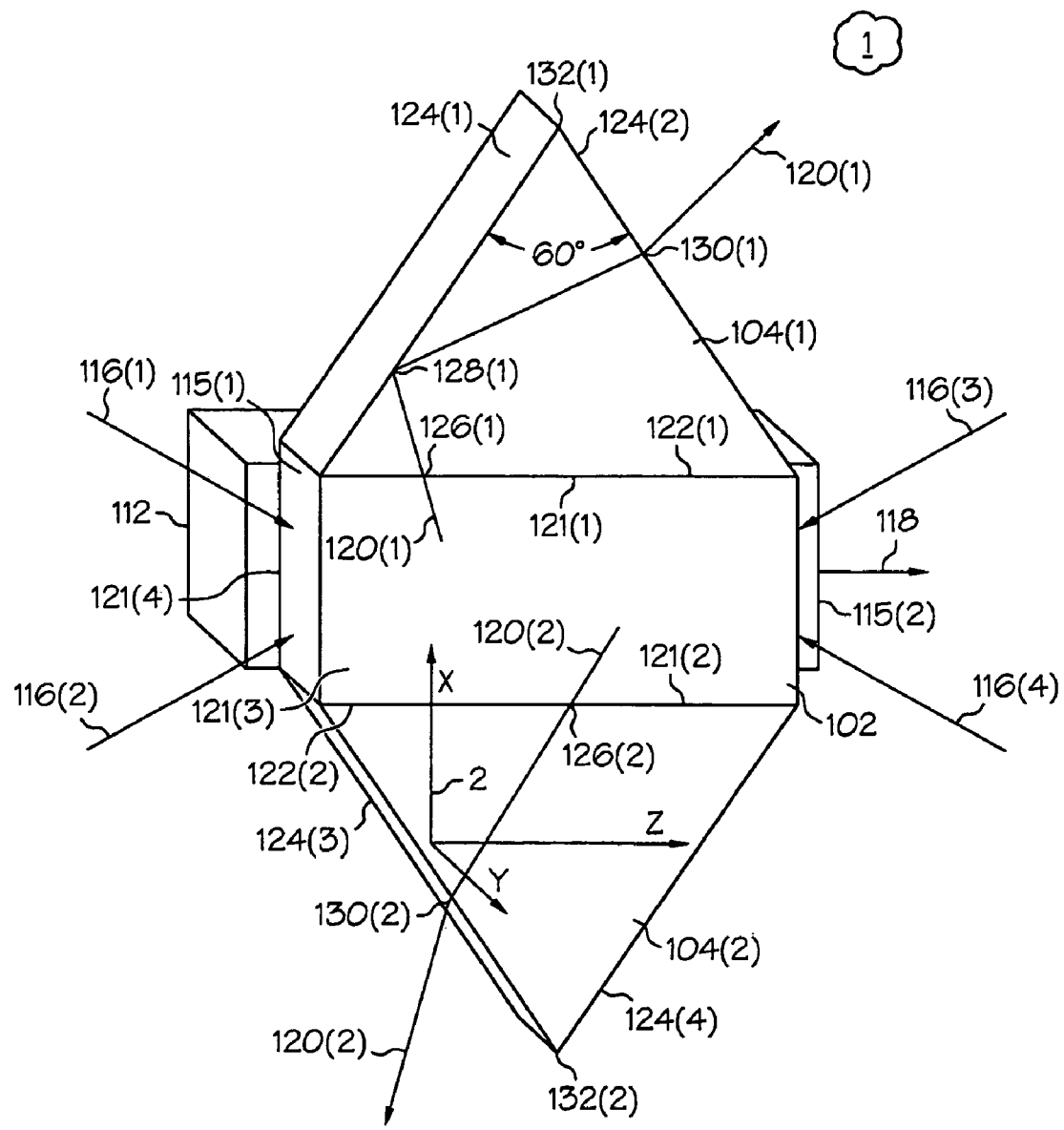
FIGS. 1 to 6 illustrate cross-sectional views of selected steps in an exemplary method of manufacturing a metal silicide electrode for a semiconductor device according to the principles of the present invention.

Turning first to FIG. 1, illustrated is the partially constructed metal silicide electrode 100 after implanting small atoms 120 into an nMOS semiconductor substrate 130 to a depth 132 no greater than about 30 nanometers into the nMOS semiconductor substrate 130. An implantation depth 132 of no greater than about 30 nanometers is preferred because it is desirable for the bulk of the small atoms 120 to be situated close to the surface of the nMOS semiconductor substrate 130 to deter the diffusion of transition metal atoms. In some preferred embodiments, however, the implantation depth 132 is no greater than about 20 nanometers, and even more preferably not greater than about 10 nanometers.

Any conventional procedures can be used to achieve implantation of the small atoms. In some preferred embodiments, the small atoms are implanted into a local region 135 of the nMOS semiconductor substrate 130 that are designed to comprise source/drain regions. Conventionally formed device components, such as isolation structures 140 and gate structures 145, or photoresist structures, or combinations thereof, can serve as masks to facilitate the localized implantation of the small atoms 120.

In some advantageous embodiments of the method, the nMOS semiconductor substrate 130 comprises silicon, although other conventional substrate materials, such as silicon-on-insulator (SOI) and silicon-germanium substrates, are also within the scope of the invention. For example, the nMOS semiconductor substrate 130 can comprise a layer located below the partially completed semiconductor device 110, and include a silicon wafer itself or a layer located above the wafer as an epitaxial layer, such as a silicon layer of SOI substrate, or other substrate. Some preferred embodiments of the nMOS semiconductor substrate 130 include <100> silicon wafers having a 0 degree or a 45 degree cut. Other types of silicon wafers, such as <111> or <011> wafers, and silicon wafers having different cut angles, can also be used, however. The nMOS semiconductor substrate 130 preferably includes a well 150 that is doped with a p-type dopant, such as boron.

The selection of the small atoms 120 for implantation reflects several criteria. The small atoms 120 preferably have a small enough radius to fit into the widen channels along the <011> direction in the nMOS semiconductor substrate 130. It is desirable that the small atoms occupy high-energy sites in the silicon substrate, such as dislocation or stacking fault areas, which deters the diffusion of transition metal atoms like nickel into these areas. It is also advantageous for the small atoms 120 to have a large enough mass to deter the diffusion of the transition metal atoms. It is also preferable that the presence of small atoms 120 in the substrate 130 does not destabilize the lattice structure of the substrate 130. It is further advantageous for the chemical properties of the small atoms 120 to be sufficiently different from silicon that the small atoms 120 do not substantially replace silicon atoms in the lattice structure of the nMOS semiconductor substrate 110.

In some preferred embodiments, the small atoms 120 comprise carbon (AMU of about 12 and atomic radius of about 70 picometers). In other preferred embodiments, the small atoms 120 comprise boron (AMU of about 11 and atomic radius of about 85 picometers). In some instances, boron is preferred because of the broad availability of implantation systems that are configured to implant boron. Some cases, a combination of different small atoms 120, such as carbon and boron, can be co-implanted or sequentially implanted into the nMOS semiconductor substrate 110.

The small atoms 120 are implanted at much lower energies than the energies used to implant dopants into deep source/drain regions, source/drain extensions or halo structures. The use of low implantation energies facilitates shallow implantation depths 132. As an example, in some embodiments, the implantation energy is less than about 7 keV, and more preferably less than about 5 keV, and even more preferably less than about 3 keV.

It is advantageous to select a dose of small atoms 120 that is large enough to prevent the diffusion of refractory metal atoms, but not too large to alter the physical or electrical properties of the source/drain electrodes or source/drain regions. For instance, in some preferred embodiments, implanting the small atoms 120 comprises an implantation dose of between about 1E13 atoms/cm$^2$ and about 5E14 atoms/cm$^2$.

Figure 2A:
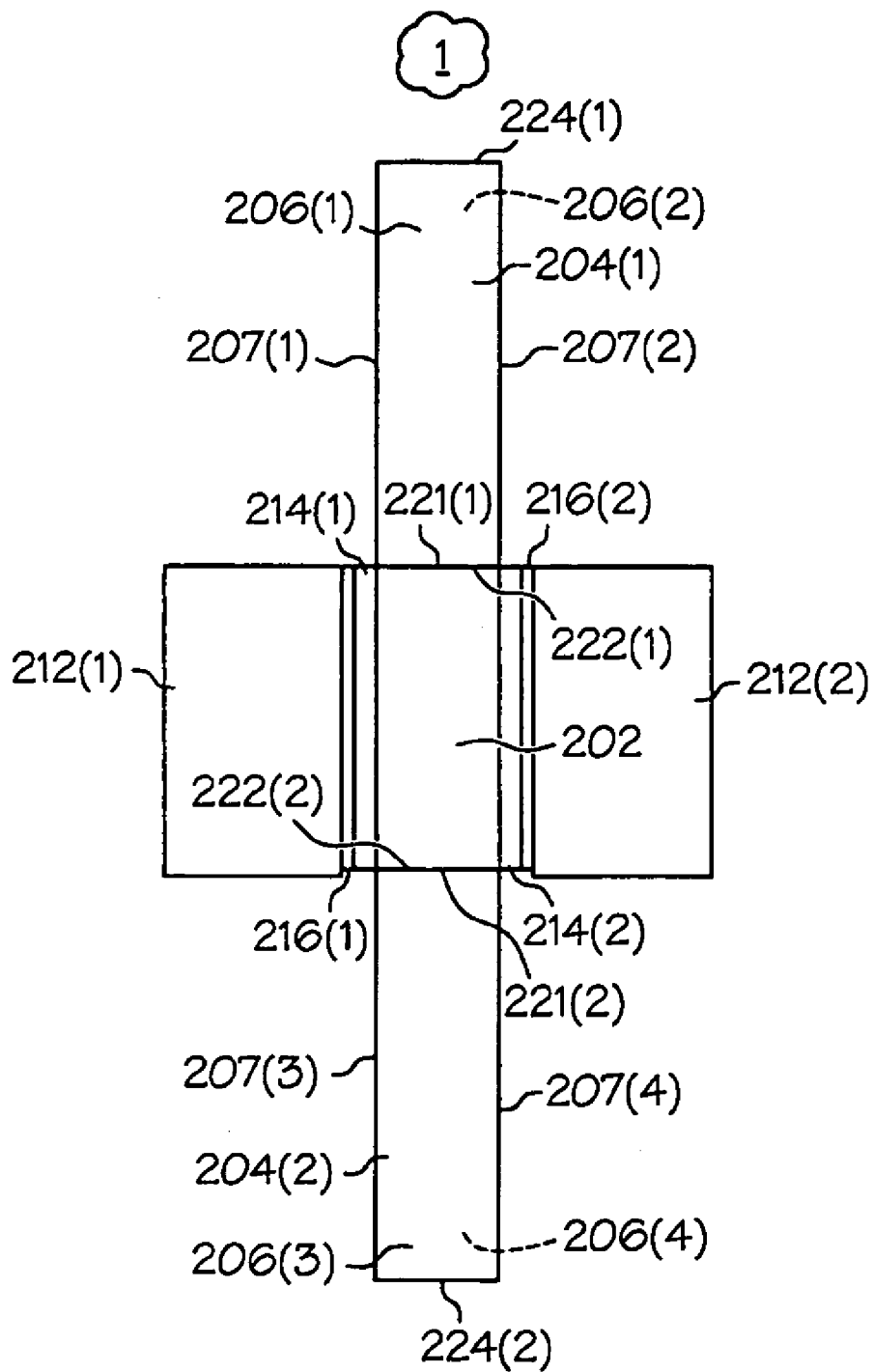
Figure 2B:
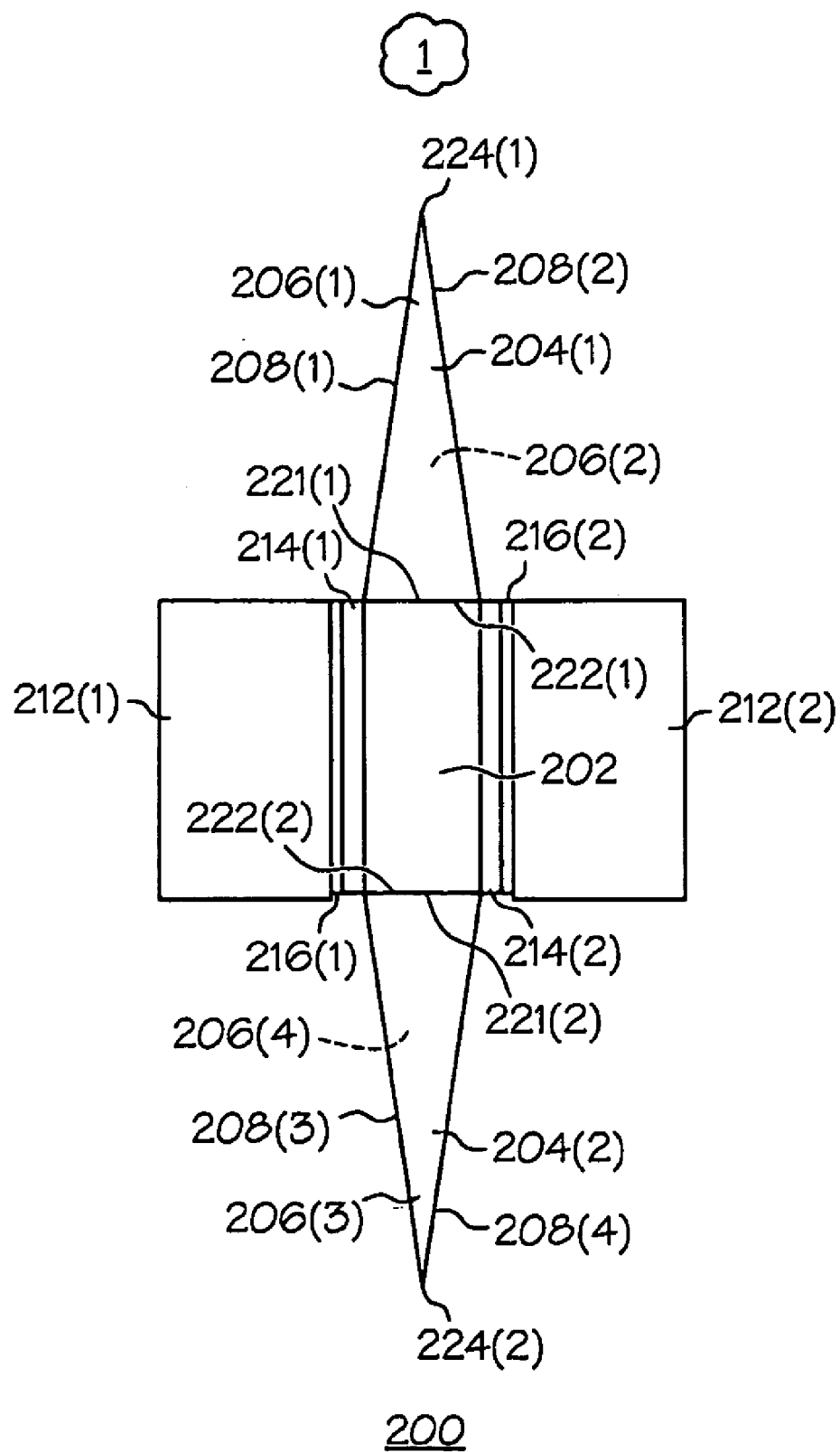
Figure 3:
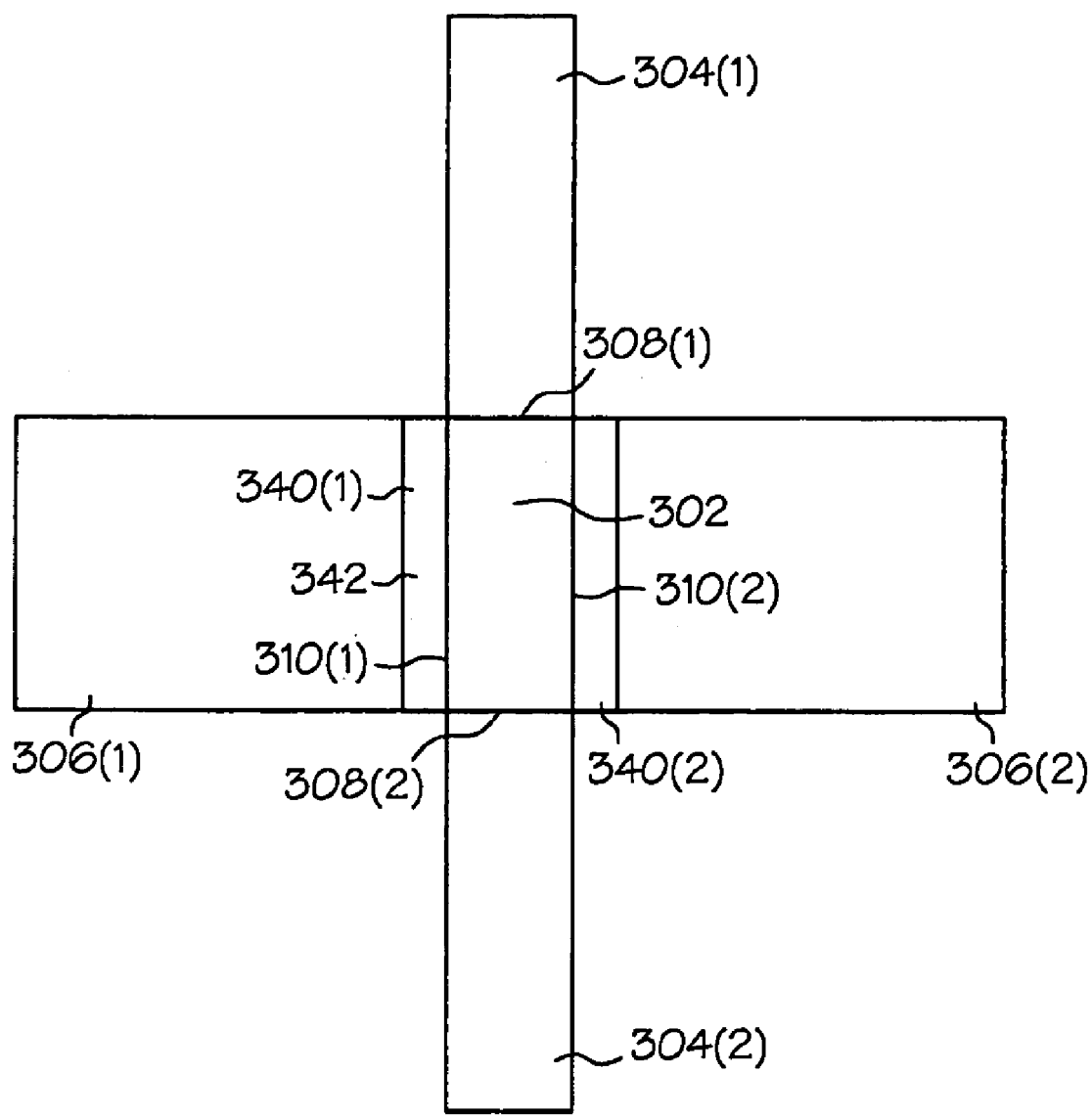

As depicted in FIG. 1, it is preferable to implant the small atoms 120 into the nMOS semiconductor substrate 130 before depositing a transition metal layer over the semiconductor substrate 130. With continuing reference to FIG. 1, FIGS. 2–3 illustrate various stages in the fabrication of the metal silicide electrode 100 where the small atoms 120 can be advantageously implanted. For instance, as shown in FIG. 2, the small atoms 120 can be implanted after implanting source/drain dopants 200 into the nMOS semiconductor substrate 130, but before annealing the substrate 130 to form source/drain regions. In other instances, as shown in FIG. 3, the small atoms 120 are implanted into the nMOS semiconductor substrate 130 after annealing the nMOS semiconductor substrate 130 to form source/drain regions 300 but before depositing a transition metal layer.

With continuing reference to FIG. 1–3, FIG. 4 shows the partially constructed electrode 100, after depositing a transition metal layer 400 over the nMOS semiconductor substrate 130, and preferably on the localized region 135 of the substrate 130 that is implanted with small atoms 120. In some embodiments the transition metal layer 400 is blanket deposited over the entire substrate 130 using physical vapor deposition, such as sputtering. In some instances, the transition metal layer has a thickness of between about 5 nanometers and about 30 nanometers.

In some embodiments, the transition metal layer 400 comprises nickel. The transition metal layer 400 can comprise combinations of transition metals such as nickel and cobalt. Nickel, however, is preferred for a number of reasons. Nickel silicide formation can be performed using relatively low temperatures as compared to other metals. This, in turn, reduces the thermal budget that the device 110 is exposed to during its manufacture, thereby improving device yields and reducing manufacturing costs. Nickel silicide has a low resistivity as compared to a number of other transition metal silicides. This is important for maintaining the series resistance of the semiconductor device 110 within acceptable limits when constructing smaller, faster devices. Moreover, nickel silicide is not prone resistivity degradation due to the necking phenomenon observed when using other metal silicides, such as cobalt silicide, at device feature sized of less than about 90 nanometers.

While maintaining reference to FIGS. 1–4, FIG. 5 depicts the partially completed metal silicide electrode 100 formed by reacting the transition metal layer 400 and the nMOS semiconductor substrate 130. As further illustrated in FIG. 5 the reaction can also form a metal silicide gate electrode 500. In certain advantageous embodiments, the metal silicide electrode 100 comprises nickel silicide, and more preferably, nickel monosilicide. In other preferred embodiments, the metal silicide electrode 100 comprises source/drain electrodes located over arsenic implanted source/drain regions 300.

Figure 4:
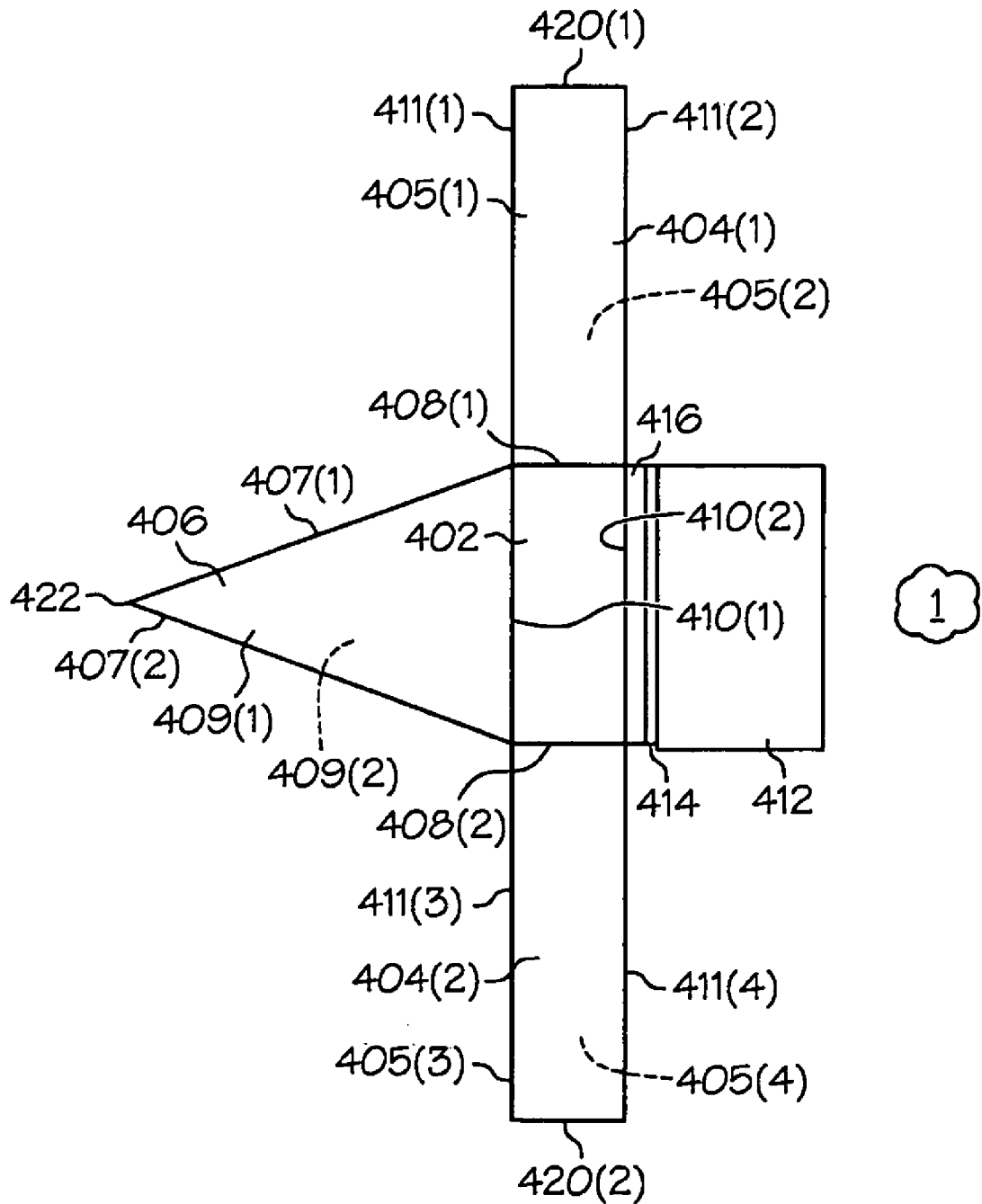

In some advantageous embodiments, metal silicide electrode 100 has a thickness that is between about 1 and about 3 times the thickness of the deposited transition metal layer 400 shown in FIG. 4. In some preferred embodiments the metal silicide electrode 100 has a thickness of between about 10 nanometers and about 60 nanometers. In some cases, as a consequence of the reaction to form the metal silicide electrode 100, the small atoms 120 diffuse throughout the metal silicide electrode 100 or source/drain region 300. In some cases, the average concentration of small atoms 120 in the metal silicide electrode 100 is less than about 1 atom percent. The small atoms 120 can have a similar low average concentration of less than about 1 atom percent in the source/drain region 300.

Advantageous embodiments of the reaction to form the metal silicide electrode 100 include heating the transition metal layer 400, comprising nickel for instance, and the nMOS semiconductor substrate 130 comprising silicon for instance, to between about 250° C. and about 550° C. for at least about 0.1 second. In other advantageous embodiments, heating comprises a first heating step to a temperature between about 250° C. and about 350° C. for at least about 0.1 second to form the transition metal silicide 100, and a second heating step to a temperature of between 350° C. and 550° C. to anneal the transition metal silicide 100. In some cases it is desirable to heat to a temperature below about 400° C. to deter the formation of nickel disilicide. In still other cases, it is preferable to remove the unreacted portions of the transition metal layer 400 between the first heating step and the second heating step. One of ordinary skill in the art would understand how to adjust the temperature and duration of heating to achieve silicidation of different transition metals.

Figure 5:
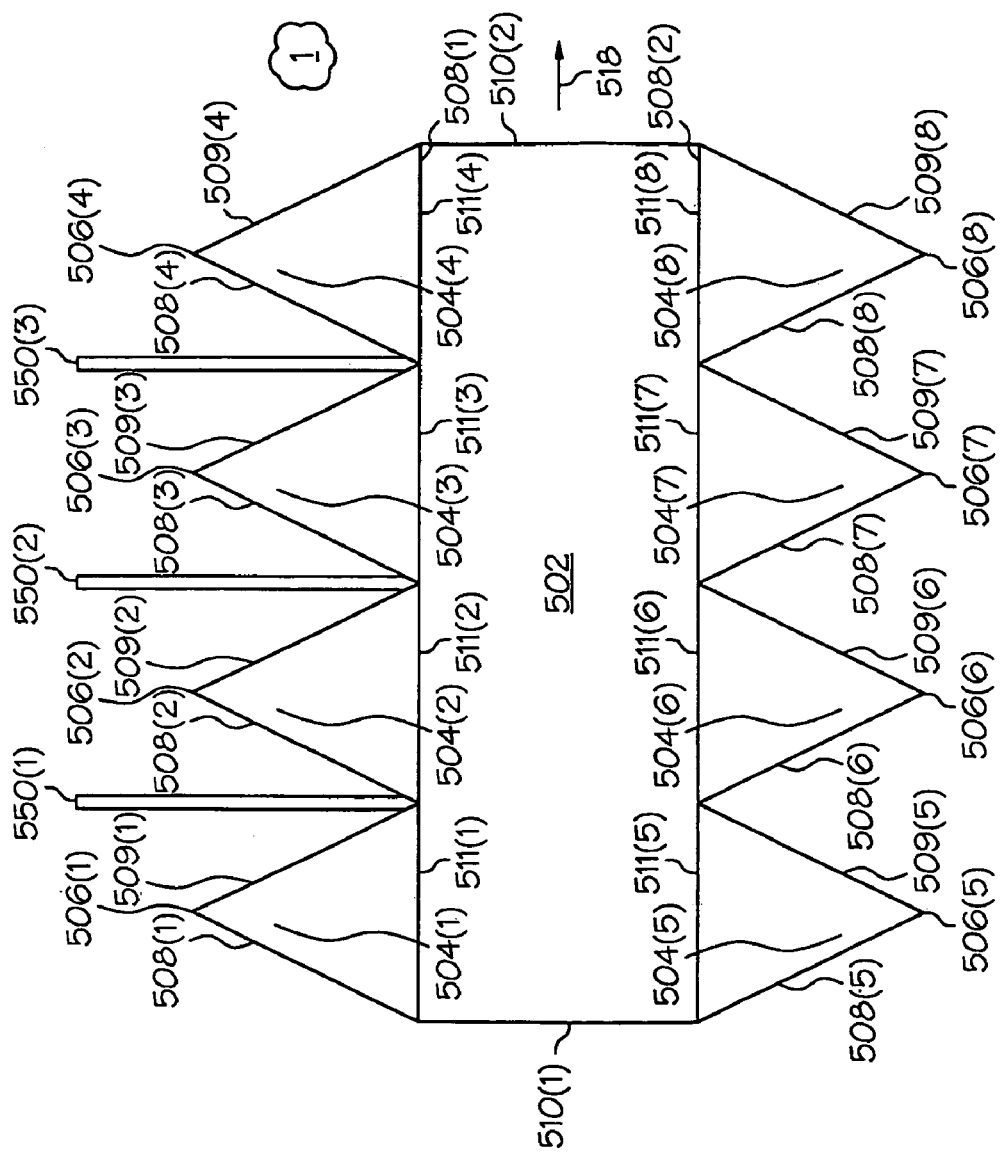
Figure 6B:
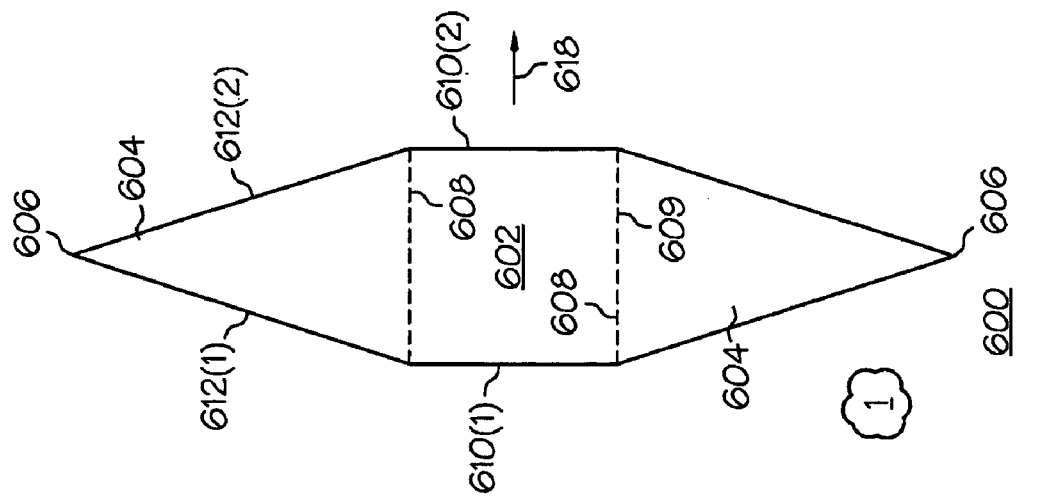
Figure 6A:
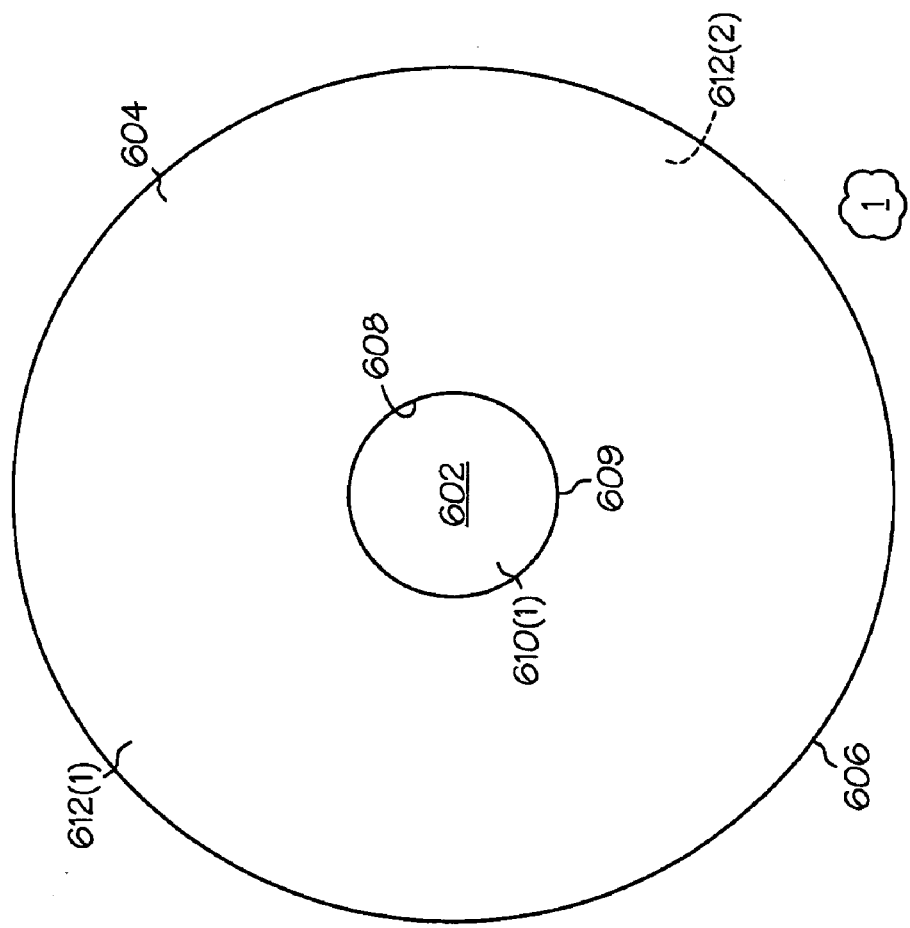

Turning now to FIG. 6, with continuing reference to FIGS. 1–5, illustrated is the metal silicide electrode 100 after removing unreacted portions of the transition metal layer 400 shown in FIG. 5. Suitable methods to remove the unreacted portions of the transition metal layer 400 include dry and wet etch procedures. One of ordinary skill in the art would understand how to tailor these procedures to selectively remove the unreacted transition metal layer 400 while leaving the metal silicide electrode 100 substantially intact.

Included in the scope of the present invention is a metal silicide electrode 100, or the semiconductor device 110 comprising one or more metal silicide electrodes 100, manufactured as described above. Of course, additional conventional steps in semiconductor device 110 fabrication can be included with the above-described method of manufacturing metal silicide electrodes to make an operative device.

Figure 7:
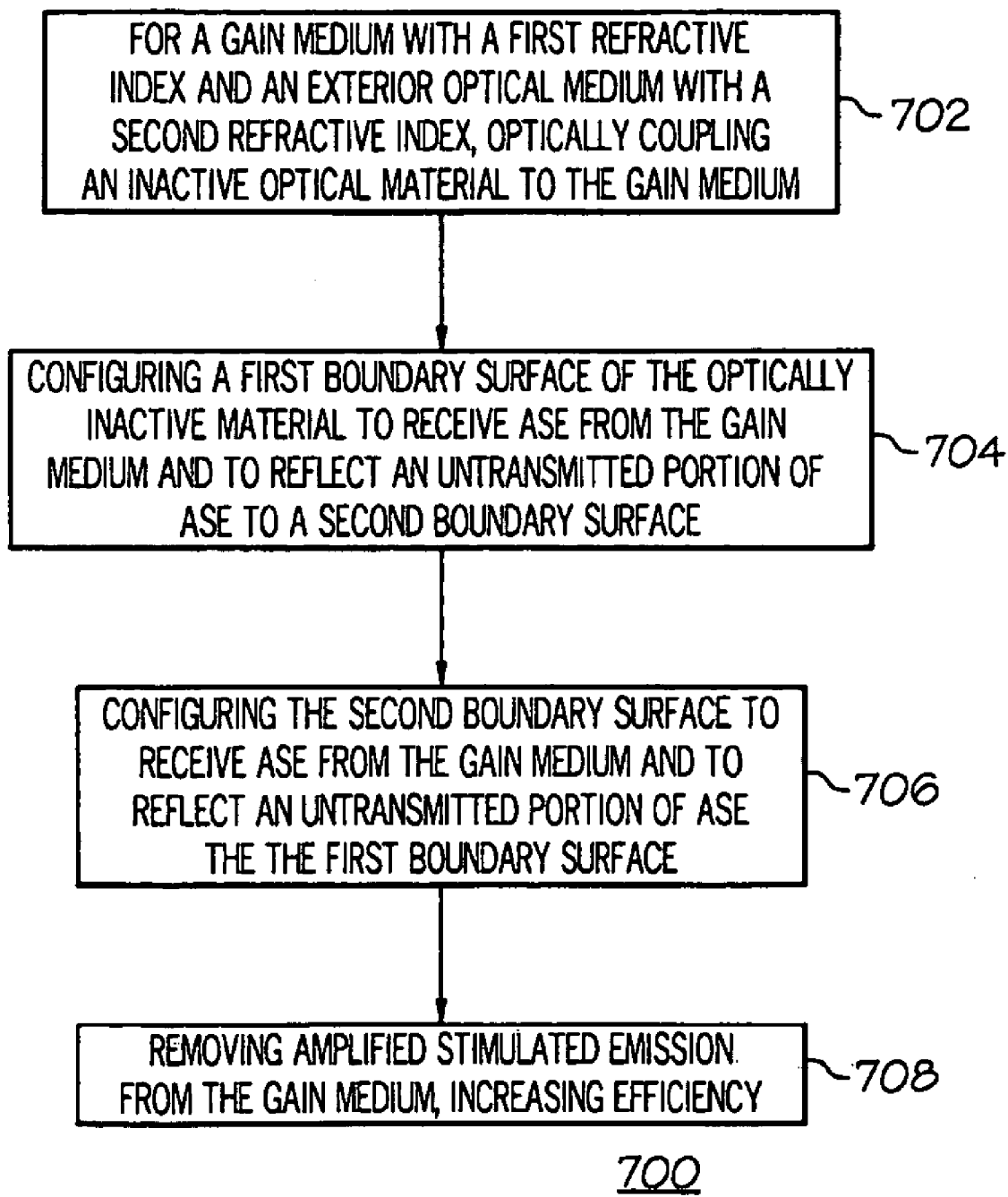
FIGS. 7–8 illustrate cross-sectional views of selected steps in an exemplary method of manufacturing an integrated circuit following the principles of the present invention.
Figure 8:
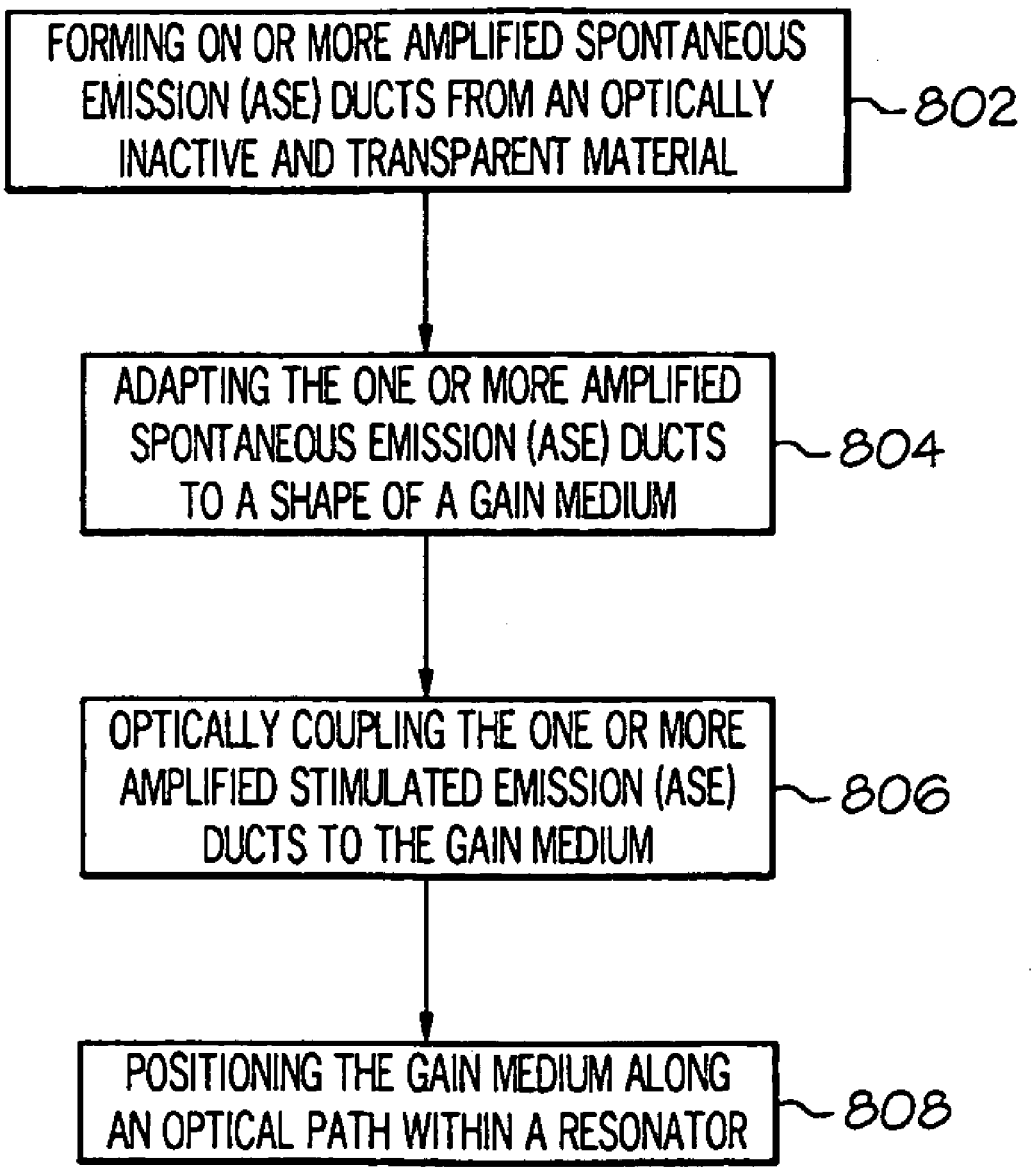

Another aspect of the present invention is a method of manufacturing an integrated circuit. FIGS. 7–8 illustrate cross-sectional views of selected steps in an exemplary method of manufacturing an integrated circuit 700 according to the principles of the present invention. Turning first to FIG. 7, illustrated is the partially completed integrated circuit 700 after forming metal silicide electrodes 710 for a semiconductor device 720. Any of the methods and materials discussed above and illustrated in FIGS. 1–6 can be used to fabricate metal silicide electrodes 710 on an nMOS substrate 730.

Preferred embodiments of the semiconductor device 720 comprise an nMOS transistor 740. The semiconductor device 720 can further include other conventionally formed transistors 750 such as pMOS transistors. In cases, the semiconductor device 720 comprises a CMOS device. However the semiconductor device can also comprise Junction Field Effect transistors, bipolar transistors, biCMOS transistors, or other conventional device components, and combinations thereof.

With continuing reference to FIG. 7, FIG. 8, illustrates the integrated circuit 1000 after forming interconnections 800, 810, 820, 830 on one or more insulating layers 840, 850, 860 located over the semiconductor device 720. One or more of the interconnections 800, 810, 820, 830 are connected to the metal silicide electrodes 710 and thereby interconnect the semiconductor device 720 to form an operative device.

Although the present invention has been described in detail, those skilled in the art should understand that they can make various changes, substitutions and alterations herein without departing from the scope of the invention in its broadest form.

What is claimed is:

1. A method of manufacturing a metal suicide electrode for a semiconductor device, comprising:
   implanting small atoms having an atomic radius of about 85 picometers or less into an nMOS semiconductor substrate to a depth no greater than about 30 nanometers, said small atoms stuffing interstitial spaces of channels in a lattice structure of the substrate;
   depositing a transition metal layer over said nMOS semiconductor substrate; and
   reacting said transition metal layer and said nMOS semiconductor substrate to form a metal silicide electrode.

2. The method as recited in claim 1, wherein said transition metal layer comprises nickel.

3. The method as recited in claim 1, wherein said small atoms comprise carbon.

4. The method as recited in claim 1, wherein said small atoms comprise boron.

5. The method as recited in claim 1, wherein said small atoms comprise a mixture of carbon and boron.

6. The method as recited in claim 1, wherein said small atoms are implanted before implanting source/drain dopants into said nMOS semiconductor substrate.

7. The method as recited in claim 1, wherein said small atoms are implanted after implanting source/drain dopants into said semiconductor substrate but before annealing said semiconductor substrate to form source/drain regions.

8. The method as recited in claim 1, wherein said small atoms are implanted into said semiconductor substrate after annealing said semiconductor substrate to form source/drain regions but before depositing said transition metal layer.

9. The method as recited in claim 1, wherein implanting said small atoms comprises an implantation energy of less than about 7 keV.

10. The method as recited in claim 1, wherein implanting said small atoms comprises an implantation energy of less than about 5 keV.

11. The method as recited in claim 1, wherein implanting said small atoms comprises an implantation energy of less than about 3 keV.

12. The method as recited in claim 1, wherein implanting said small atoms comprises an implantation dose of between about 1E13 atoms/cm$^2$ and about 5E14 atoms/cm$^2$.

13. The method as recited in claim 1, wherein reacting comprises heating said transition metal layer and said semiconductor substrate to between about 250° C. and about 550° C. for at least about 0.1 second.

14. The method as recited in claim 1, wherein said metal silicide electrode comprises source/drain electrodes located over arsenic implanted source/drain regions.

15. The method as recited in claim 1, wherein said metal silicide electrode comprises nickel silicide source/drain electrodes located over arsenic implanted source/drain regions.

16. A method of manufacturing an integrated circuit comprising:
    forming metal silicide electrodes for a semiconductor device, comprising:
        implanting small atoms having an atomic radius of about 85 picometers or less into an nMOS semiconductor substrate, said small atoms stuffing interstitial spaces of channels in a lattice structure of the substrate;
        forming a transition metal layer over said nNAOS semiconductor substrate; and
        reacting said transition metal layer and said nMOS semiconductor substrate to form said metal silicide electrode; and
    forming interconnect metals lines on one or more insulating layers located over said semiconductor device and connecting said interconnects with said metal suicide electrodes to form an operative device.

17. The method as recited in claim 16, wherein said metal silicide electrodes comprise nickel silicide.

18. The method as recited in claim 16, wherein said small atoms comprise carbon.

19. The method as recited in claim 16, wherein said small atoms comprise boron.

20. The method as recited in claim 16, wherein said semiconductor device is selected from the group consisting of:
    nMOS transistors;
    CMOS devices;
    Junction Field Effect transistors;
    bipolar transistors;
    biCMOS transistors; and
    combinations thereof.

21. The method as recited in claim 1, wherein said small atoms retard diffusion of said metal into the channels.

22. The method as recited in claim 16, wherein said small atoms retard diffusion of said metal into the channels.

23. The method as recited in claim 16, wherein the small atoms are implanted to a depth no greater than about 30 nanometers.

* * * * *